(12) United States Patent
Khan et al.

(10) Patent No.: US 11,937,511 B2
(45) Date of Patent: Mar. 19, 2024

(54) MULTIFUNCTION MAGNETIC AND PIEZORESISTIVE MEMS PRESSURE SENSOR

(71) Applicant: Apple Inc., Cupertino, CA (US)

(72) Inventors: Majid Khan, Sunnyvale, CA (US); Roberto M. Ribeiro, San Jose, CA (US); Savas Gider, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/109,180

(22) Filed: Feb. 13, 2023

(65) Prior Publication Data

US 2023/0189654 A1  Jun. 15, 2023

Related U.S. Application Data

(62) Division of application No. 17/030,275, filed on Sep. 23, 2020, now Pat. No. 11,605,774.

(51) Int. Cl.
| | |
|---|---|
| *H10N 30/20* | (2023.01) |
| *G01L 1/16* | (2006.01) |
| *G01L 1/18* | (2006.01) |
| *G01L 9/00* | (2006.01) |
| *G01L 19/00* | (2006.01) |
| *G01S 3/781* | (2006.01) |
| *H10N 30/00* | (2023.01) |
| *H10N 30/88* | (2023.01) |

(52) U.S. Cl.
CPC ............ *H10N 30/88* (2023.02); *G01L 1/167* (2013.01); *G01L 1/183* (2013.01); *G01L 9/0055* (2013.01); *G01L 19/0092* (2013.01); *G01S 3/781* (2013.01); *H10N 30/1071* (2023.02); *H10N 30/2047* (2023.02); *B81B 2201/0264* (2013.01); *B81B 2201/032* (2013.01)

(58) Field of Classification Search
CPC .............. H10N 30/88; H10N 30/1071; H10N 30/2047; G01S 3/781; B81B 2201/0264; B81B 2201/032; G01L 9/0055; G01L 19/0092; G01L 1/167; G01L 1/183
See application file for complete search history.

(56) References Cited

U.S. PATENT DOCUMENTS

| | | | |
|---|---|---|---|
| 9,341,530 B2 | 5/2016 | Lee | |
| 9,717,411 B2 * | 8/2017 | Kang | ........................ A61B 3/16 |
| 11,486,782 B2 | 11/2022 | Hueck | |
| 2006/0174712 A1 * | 8/2006 | O'Brien | .................. B81B 7/007 |
| | | | 73/756 |

(Continued)

FOREIGN PATENT DOCUMENTS

WO   WO-2020073357 A1 *  4/2020  ............ H04R 19/04

*Primary Examiner* — David Vu
*Assistant Examiner* — Brandon C Fox
(74) *Attorney, Agent, or Firm* — BAKERHOSTETLER

(57) ABSTRACT

Aspects of the subject disclosure include a pressure-sensing device consisting of a housing including a membrane and one or more piezoresistive elements disposed on the membrane to sense a displacement due to a deflection of the membrane. A first set of electrodes is disposed over the membrane, and a second set of electrodes is disposed on a permeable port of the device at a distance from the membrane. The first and second sets of electrodes form an electrostatic actuator to exert a repulsive force onto the membrane to reduce the deflection of the membrane.

19 Claims, 5 Drawing Sheets

(56) References Cited

U.S. PATENT DOCUMENTS

| | | |
|---|---|---|
| 2006/0241354 A1 | 10/2006 | Allen |
| 2016/0153856 A1* | 6/2016 | Hayashi .................. G01C 5/06 73/384 |
| 2018/0335359 A1 | 11/2018 | Eckinger |
| 2021/0148776 A1* | 5/2021 | Eckinger ................ B81C 3/001 |

* cited by examiner

MULTIFUNCTION MAGNETIC AND PIEZORESISTIVE MEMS PRESSURE SENSOR

CROSS-REFERENCE TO PRIOR APPLICATIONS

This application is a divisional of the U.S. patent application Ser. No. 17/030,725 entitled "MULTIFUNCTION MAGNETIC AND PIEZORESISTIVE MEMS PRESSURE SENSOR," filed Sep. 23, 2020, which is hereby incorporated by reference in its entirety for all purposes.

TECHNICAL FIELD

The present description relates generally to sensor technology, and more particularly, but not exclusively, to a multifunction magnetic and piezoresistive microelectromechanical sensor (MEMS) pressure sensor.

BACKGROUND

Portable electronic devices such as smartphones and smartwatches include pressure sensors for perceiving environmental pressure. The pressure sensor is sometimes used for barometric pressure measurements, which can be used to identify changes in elevation or depth in water. The changes in elevation are sometimes used to identify a location or exercise performed by a user of the device. For example, an activity monitor application running on the processing circuitry of the device worn or carried by a user while the user walks or runs up a flight of stairs or a hill may measure elevation changes. Portable electronic devices most commonly use capacitive or piezoresistive microelectromechanical system (MEMS) pressure sensors.

MEMS pressure sensors used in consumer electronic devices are operational within a defined pressure range (e.g., 30 kPa to 110 kPa), and underwater pressures can be as high as 3000 kPa (at about 300 m under water). MEMS pressure sensors typically rely on a diaphragm that deflects to detect a change in pressure. The performance of the sensor is dependent upon the sensor's linearity. The linearity of the sensor decreases as the diaphragm deflection increases.

BRIEF DESCRIPTION OF THE DRAWINGS

Certain features of the subject technology are set forth in the appended claims. However, for the purpose of explanation, several embodiments of the subject technology are set forth in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description, which includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block-diagram form in order to avoid obscuring the concepts of the subject technology.

In some aspects, the subject disclosure provides a multifunction magnetic and resistive microelectromechanical system (MEMS) device. The disclosed MEMS device combines a magnetic out-of-plane actuator and a piezoresistive pressure sensor to provide an extended pressure-sensing range. The magnetic actuator can be activated by a flow of an electric current through magnetic coils to cause attraction and/or repulsion of the membrane via the Lorentzian force. The pressure sensing can be achieved through piezoresistive or magnetic measurement.

The extended range of pressure sensing of the MEMS device of the subject technology enables underwater pressure sensing for dive computer functions. The existing pressure sensors typically cover a pressure range of about 30 kpa to 160 kpa, which is usable for a limited underwater depth (e.g., about 10 feet). The magnetic coils can be activated to reduce membrane deflection to avoid bottoming out at high pressures.

Other important aspects of the disclosed MEMS device include water and contamination detection, a magnetic actuator driven at a set frequency, displacement measurement by the piezoresistor, and avoiding inaccurate recording of exercise minutes or flights of stairs climbed due to pressure swings caused by water evaporation and capillary forces. Furthermore, the MEMS device of the subject technology can be used as an integrated microphone or an ambient temperature sensor, as explained herein. The magnetic actuator displacement can be measured to record sound waves. When driven actively, the magnetic actuator can emit ultrasonic waves, of which the time-of-flight (ToF) across a device cavity is temperature-dependent and can be calibrated to measure ambient temperature.

Figure 1A:
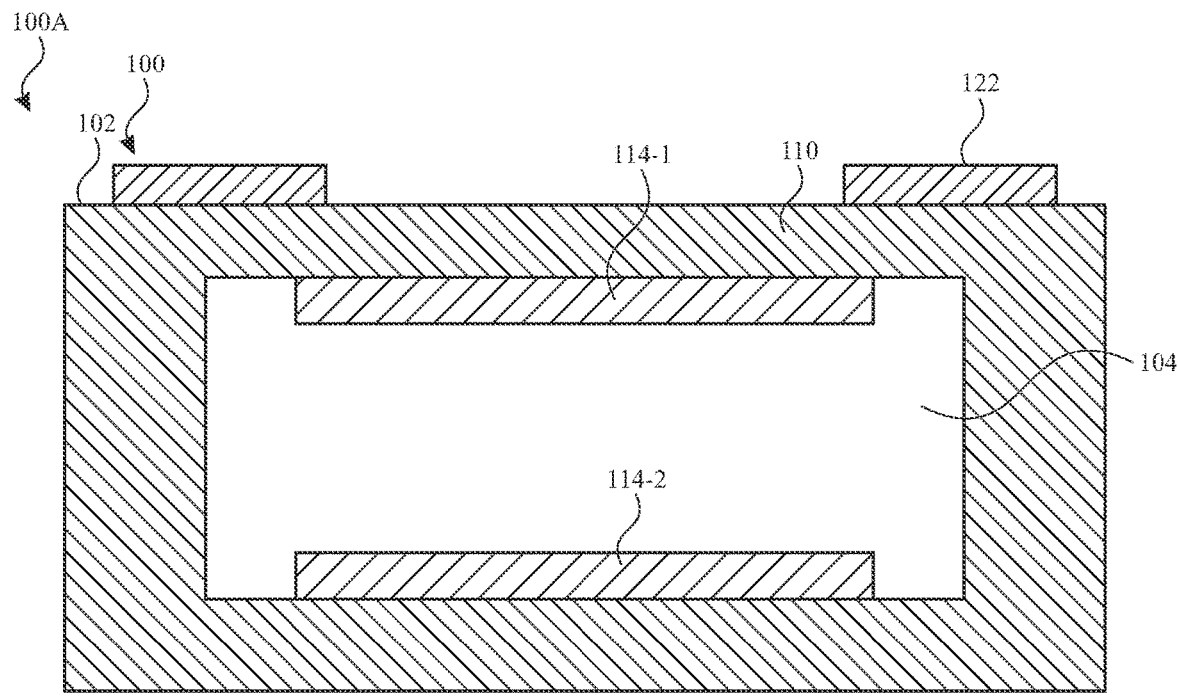
FIGS. 1A and 1B are schematic diagrams illustrating examples of a structure and an in-operation scheme of a multifunction magnetic and resistive microelectromechanical system (MEMS) sensor device, in accordance with various aspects of the subject technology.
Figure 1B:
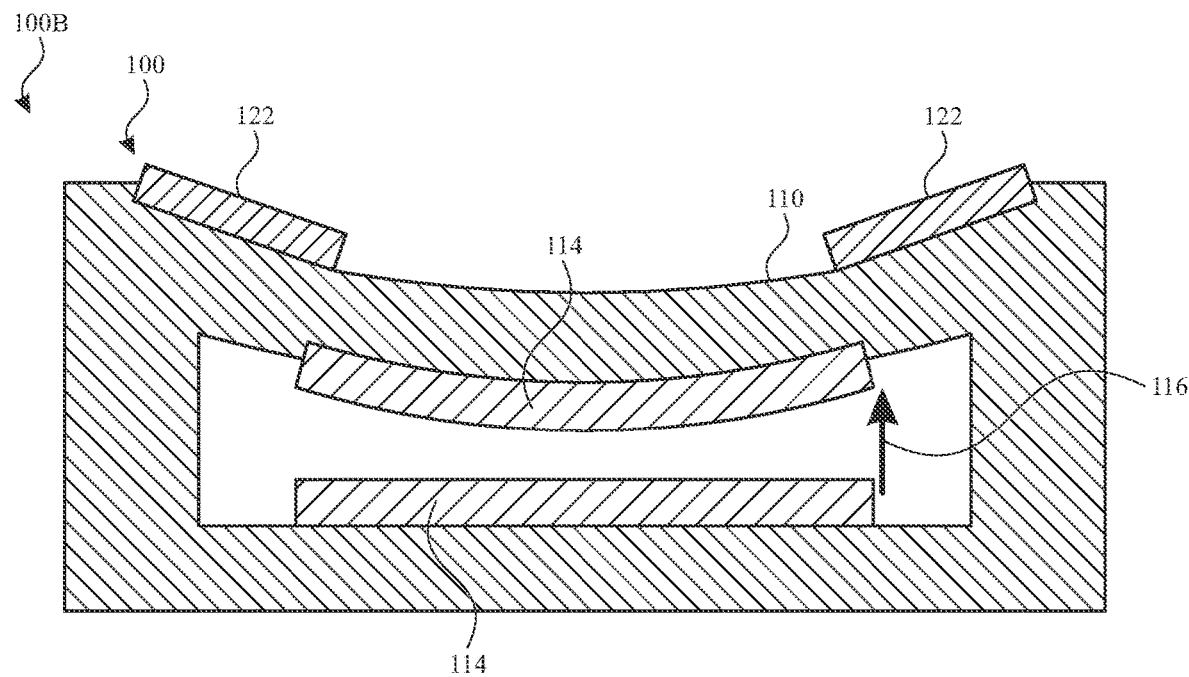

FIGS. 1A and 1B are schematic diagrams illustrating examples of a structure 100A and an in-operation scheme 100B of a multifunction magnetic and resistive MEMS device 100, in accordance with various aspects of the subject technology. In one or more aspects, the multifunction magnetic and resistive MEMS device 100 (hereinafter, device 100) can be an environmental sensor, such as a pressure sensor, and can be integrated with a hand-held communication device such as a smartphone or a smartwatch. The structure 100A of the device 100 includes a housing 102 enclosing a cavity 104, a membrane 110, planar magnetic coils 114-1 and 114-2 (hereinafter, coils 114) and piezoresistive elements 122. The housing 102 can be made of materials including stainless steel, titanium or silicon and can have a width within a range of about 200-700 µm. The cavity 104 can be filled with air or an inert gas such as helium or other gases at a known pressure, for example, the atmospheric pressure or can be under vacuum.

The membrane 110 can be made of silicon with a thickness of a few micrometers (e.g., 3-10 µm). The coils 114-1 and 114-2 are attached to internal surface of the membrane 110 and a bottom surface of the housing 102, respectively, as shown in FIG. 1A. The coils 114 form a magnetic actuator and can be actuated by applying a suitable electric current (e.g., a few mA) to the coils 114. Applying current to the coils 114 can generate repulsion or attraction due to the Lorentz force. The piezoresistive elements 122 are attached to the membrane 110 and can provide variable resistances that vary with displacement caused by the bending of the membrane 110 due to the ambient pressure or deflection caused by the attractive magnetic force between the coils 114. Ambient pressure can be measured through piezoresistive or magnetic measurement. In some aspects, the piezoresistive measurement can be performed by using a Wheatstone bridge circuit that converts a small change in resistance of the piezoresistive elements 122 to an output voltage or by using other methods. In one or more aspects, the magnetic measurement can be performed by applying a current to the coils 114 and measuring an output voltage due to a change of inductance caused by movement of the coils 114 or by using other methods.

FIG. 1B shows the in-operation scheme 100B of the device 100. In the in-operational scheme 100B, the membrane 110 is deflected due to the applied pressure (e.g., the ambient pressure). The amount of deflection, as indicated by the arrow 116, can be controlled by the Lorentz force of the coils 114. The deflection of the membrane 110 depends upon the applied pressure to the membrane 110 and can saturate the membrane 110 such that it sticks to the bottom of the cavity 104 of FIG. 1A. In other words, without the use of the coils 114, the device 100 has a limited range of operation that is restricted by the saturation of the membrane 110. This limited range can be extended by applying a suitable current to the coils 114 to prevent the saturation of the membrane 110 by providing a counterforce (the Lorentz force), as shown in FIG. 1B. The Lorentz force balances out the force due to the applied pressure over the membrane 110 and can be used to calibrate the pressure-sensing aspect of the device 100.

Figure 2:
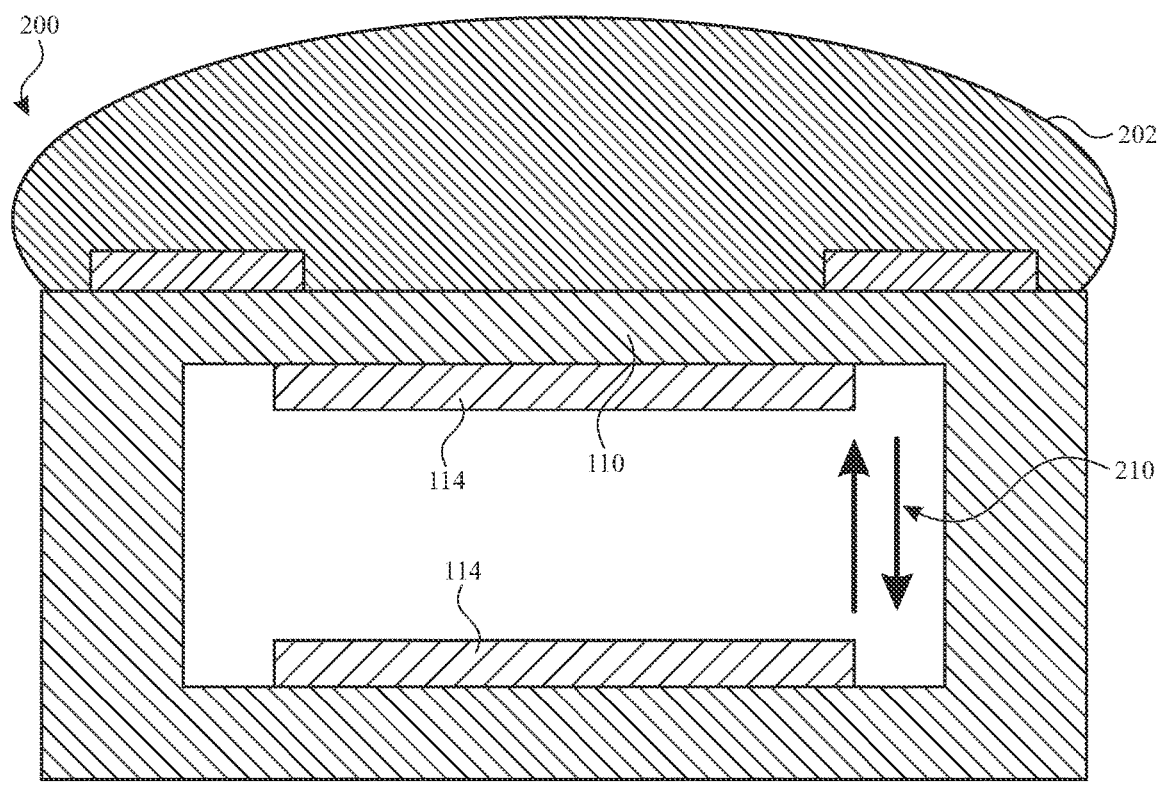
FIG. 2 is a schematic diagram illustrating a contaminant-detection application of an example multifunction magnetic and resistive MEMS device, in accordance with various aspects of the subject technology.

FIG. 2 is a schematic diagram illustrating a contaminant-detection application of an example multifunction magnetic and resistive MEMS device 200, in accordance with various aspects of the subject technology. The multifunction magnetic and resistive MEMS device 200 (hereinafter, device 200) is similar to the device 100 of FIG. 1A and, in the application shown in FIG. 2, is used to detect a contaminant 202 such as water over the membrane 110, which cause an error in the pressure reading of typical pressure sensors. As the water evaporates the error disappears; however, it is hard to tell whether the change in reading was due to a change of height or the presence of water. The subject technology enables determining the presence of a contaminant 202 (e.g., water) on the membrane 110. This allows the device 200 to avoid indicating false exercise minutes or number of flights of stairs climbed due to pressure swings caused by water evaporation.

The damping factor $\xi$ of the membrane 110 is known to be proportional to an inverse of the square root of the mass m of the membrane, including the mass m of the contaminant 202 (e.g., water). The mass dependence of the damping factor $\xi$ of the membrane 110 can be used to detect the presence of the contaminant 202 such as water. For this application the coils 114 are actuated using a signal at a set frequency and the change in damping is measured to determine the change of mass of the membrane 110 due to the presence of the contaminant 202 (e.g., water). The effect of the damping factor $\xi$ on the membrane 110 can be measured by actuating the coils 114 to vibrate the membrane 110 and by using the piezoresistive elements to measure the displacement of the membrane 110. If the displacement is different from the calibrated displacement using the same current with the same frequency to the coils 114, it is inferred that a contaminant is present on the membrane. In some aspects, the presence of other contaminants such as dirt and particulate matter can be detected similarly.

Figure 3:
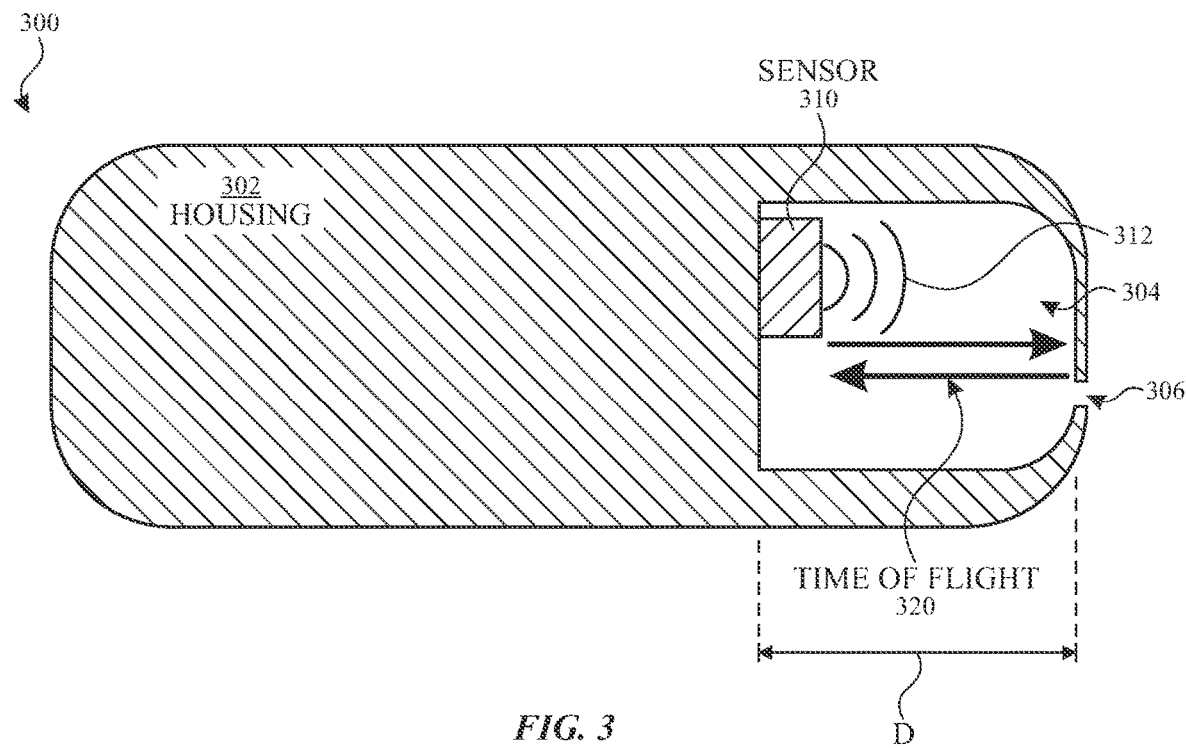
FIG. 3 is a schematic diagram illustrating an example apparatus for temperature measurement using a multifunction magnetic and resistive MEMS device, in accordance with various aspects of the subject technology.

FIG. 3 is a schematic diagram illustrating an example apparatus 300 for temperature measurement using a multifunction magnetic and resistive MEMS device, in accordance with various aspects of the subject technology. The apparatus 300 includes a housing 302, a cavity 304, a port 306 and a sensor 310, which is a multifunction magnetic and resistive MEMS device such as the device 100 of FIG. 1A, described above. The sensor 310 is capable of generating ultrasonic waves 312 with the cavity 304. The ultrasonic waves 312 can be generated by the vibrating membrane 110 of FIG. 1A caused by the application of a current at a suitable frequency (e.g., KHz to low MHz) to the coils 114 of FIG. 1A. A ToF 320 for a two-way travelling of the ultrasonic waves 312 along the depth D of the cavity 304 can be measured by monitoring the resistance of the piezoresistive element to detect the reflected ultrasonic wave. The TOF 320 is the time difference between the emitted and reflected waves. Knowing the depth D and the ToF 320, the speed v of the ultrasonic waves 312 can be determined. It is known that the speed v is proportional to the square root of the ambient temperature T. Therefore, the apparatus 300 allows for determining the ambient temperature T by measuring the ToF 320, as explained above.

Figure 4:
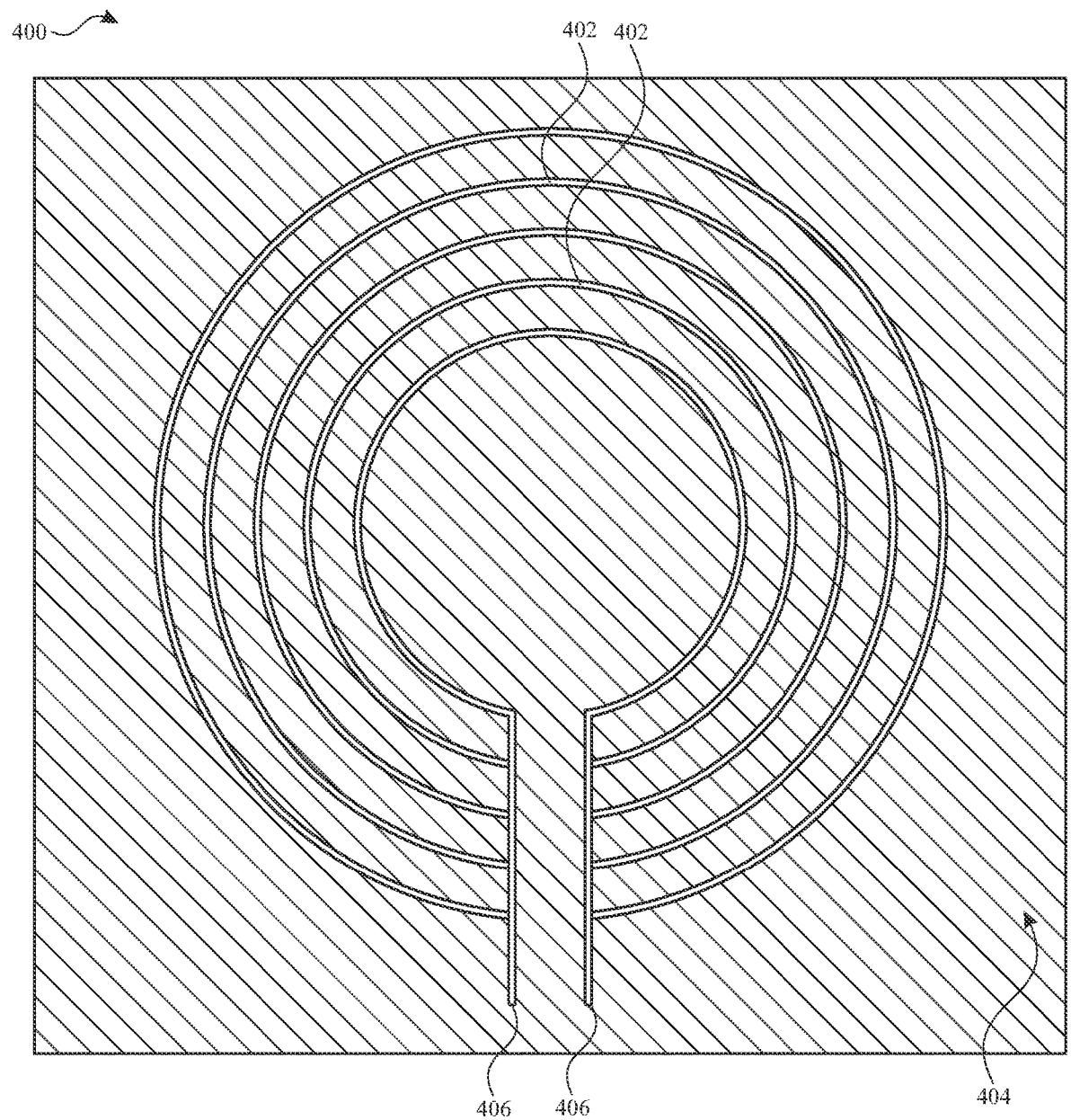
FIG. 4 is a schematic diagram illustrating an example structure of a planar magnetic coil of a multifunction magnetic and resistive MEMS device, in accordance with various aspects of the subject technology.

FIG. 4 is a schematic diagram illustrating an example structure of a planar magnetic coil 400 of a multifunction magnetic and resistive MEMS device, in accordance with various aspects of the subject technology. The planar magnetic coil 400, as shown in FIG. 4, includes a number of loops 402 of an electrically conductive layer (trace) created on a substrate 404. The loops 402, for example, can be produced on the MEMS cavity by using photolithographic techniques. The loops 402 end in terminals 406 that can be used to apply an alternating current to the planar magnetic coil 400 to generate a magnetic field. The planar magnetic coil 400 can be used as the coils 114 of the device 100 of FIG. 1.

Figure 5A:
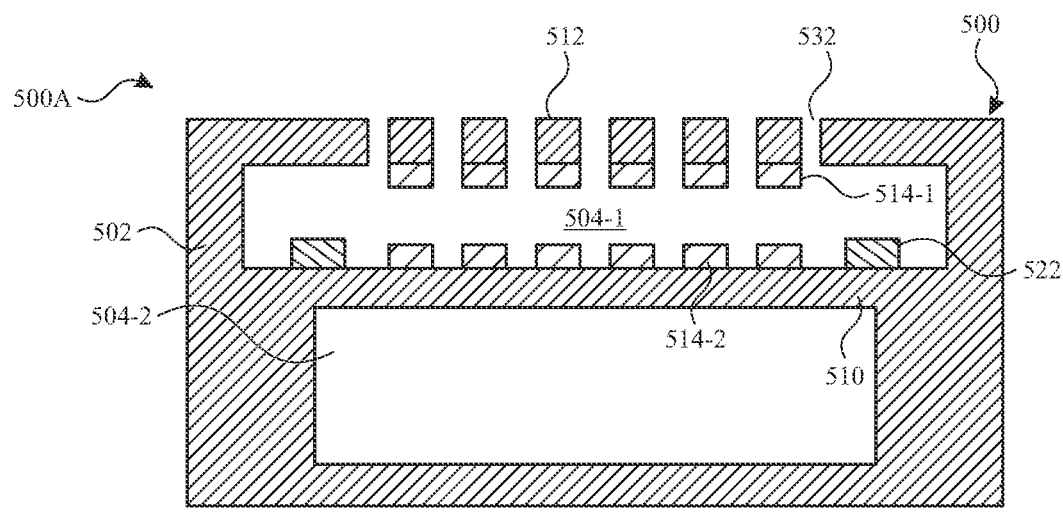
FIGS. 5A, 5B and 5C are schematic diagrams illustrating examples of a structure and in-operation schemes of a multifunction capacitive and resistive MEMS device, in accordance with various aspects of the subject technology.
Figure 5B:
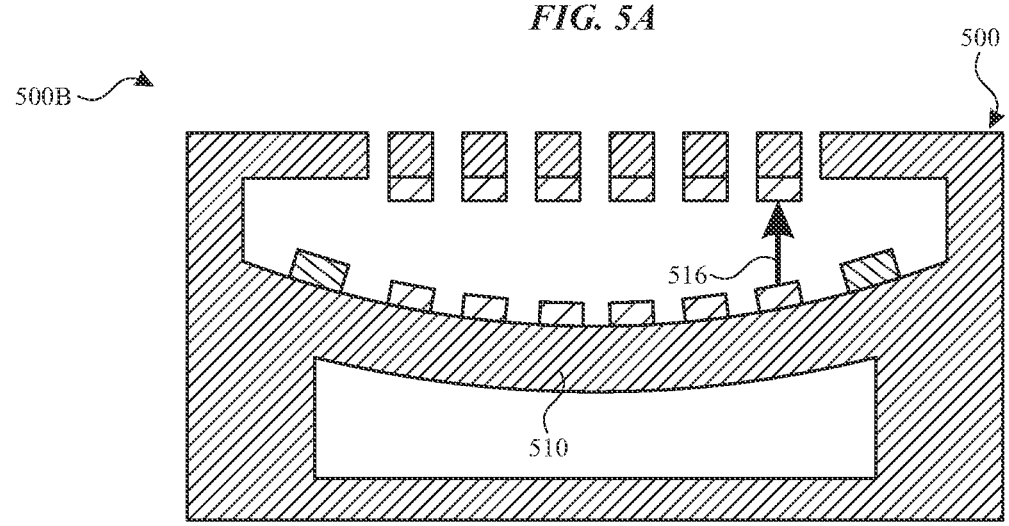
Figure 5C:
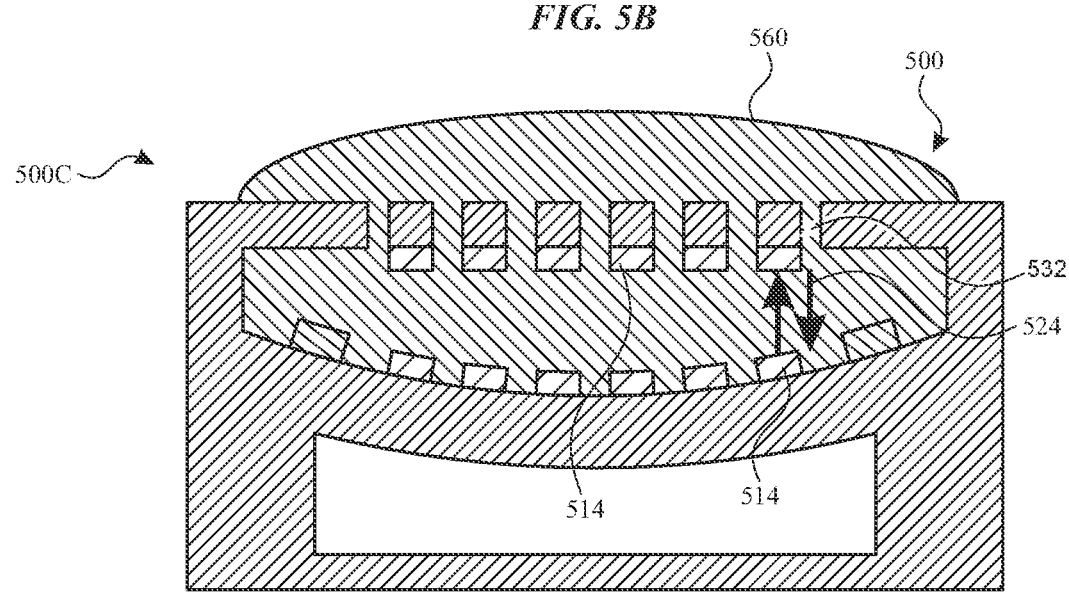

FIGS. 5A, 5B and 5C are schematic diagrams illustrating examples of a structure and in-operation schemes of a multifunction capacitive and resistive MEMS device 500, in accordance with various aspects of the subject technology. FIG. 5A shows the structure 500A of the multifunction capacitive and resistive MEMS device 500 (hereinafter, device 500). In one or more aspects, device 500 can be an environmental sensor, such as a pressure sensor, and can be integrated with a hand-held communication device such as a smartphone or a smartwatch. The structure 500A of the device 500 includes a housing 502 enclosing a first cavity 504-1 and a second cavity 504-2 separated by a membrane 510, a lid 512, electrodes 514 (514-1 and 514-2) and piezoresistive elements 522. The lid 512 is air permeable and includes a number of air vents 532 and the electrodes 514-1 and 514-2 are attached, respectively, to an internal surface of the lid 512 and a surface of the membrane 510 facing the first cavity 504-1. The electrodes 514 form an out-of-plane actuator (capacitor) and can be connected to a control voltage to control their separation. The pressure sensing can be achieved through piezoresistive measurement by the piezoresistive elements 522 or by the capacitive measurements using the electrodes 514.

FIG. 5B shows a first in-operation scheme 500B, in which the electrodes 514 create an electrostatic force 516 in response to the control voltage. The electrostatic force 516 can be an attractive force moving the membrane 510 toward the lid 512, thus reducing deflection of the membrane 510 due to high pressure in order to prevent the membrane saturation. Alternatively, a capacitance between the electrodes 514 that is dependent on the separation of the electrodes 514 can be used to measure the deflection of the membrane 510, which is an indication of the pressure exerted on the membrane 510.

FIG. 5C shows a second in-operation scheme 500C, in which the electrodes 514 create an electrostatic force 524 in response to the control voltage. The presence of water or other contaminants (e.g., oil or sweat) can be detected when the membrane 510 is actively driven by the electrostatic force of the electrodes 514, for example, by measuring a damping factor $\xi$ of the membrane 510, as discussed above with respect to FIG. 2.

The device 500 of the subject technology can be used as an integrated microphone or an ambient temperature sensor, as explained above with respect to the sensor 310 of FIG. 3. Further, the capacitive actuator displacement can be measured to record sound waves. When driven actively, the capacitive actuator can emit ultrasonic waves, the ToF of which is temperature dependent across a device cavity and can be calibrated to measure ambient temperature, as described above with respect to the sensor 310 to FIG. 3.

Figure 6:
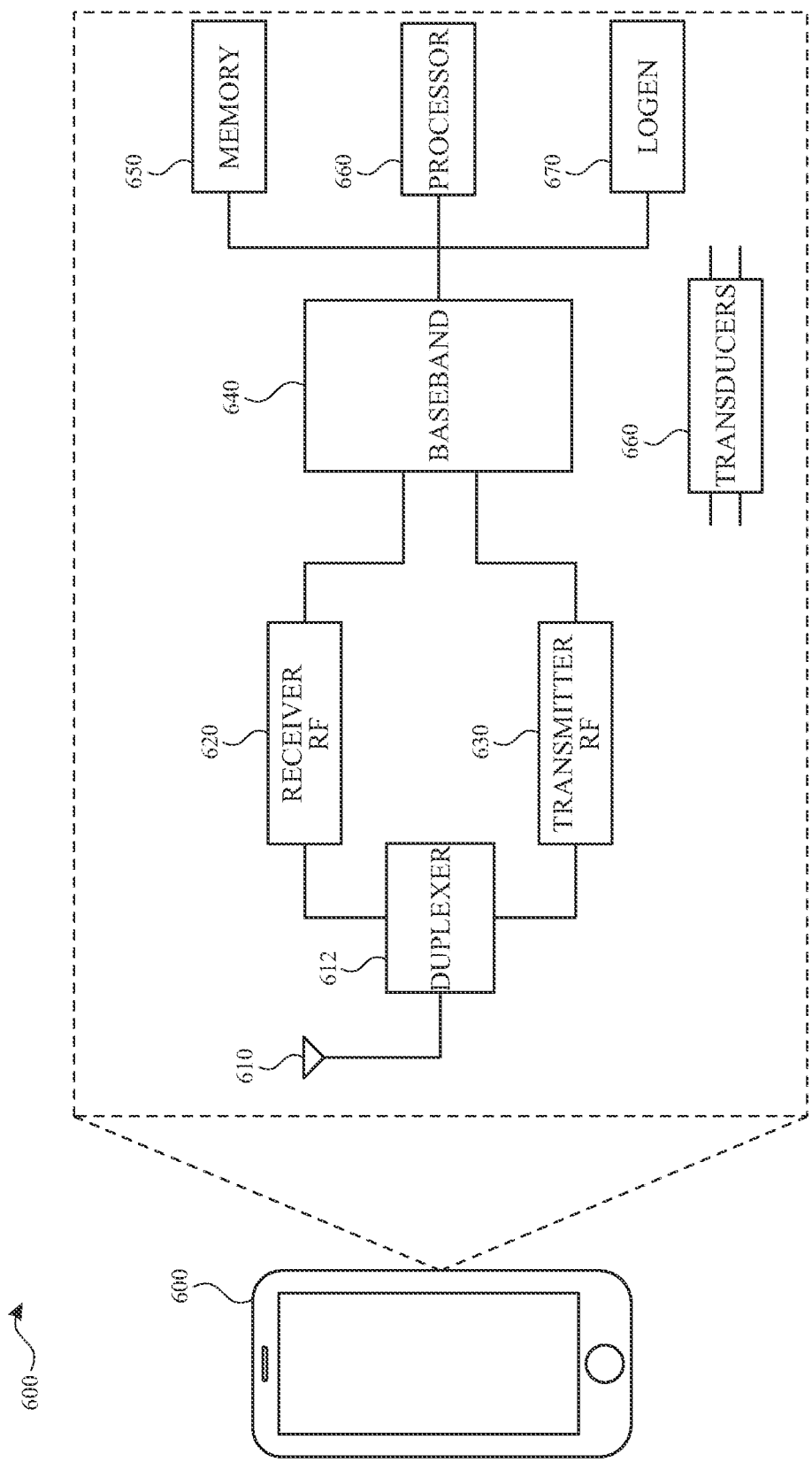
FIG. 6 illustrates a wireless communication device in which aspects of the subject technology are implemented.

FIG. 6 illustrates a wireless communication device 600 in which aspects of the subject technology are implemented. In one or more implementations, the wireless communication device 600 can be a smartphone or a smartwatch that hosts an apparatus of the subject technology, for example, for pressure, elevation and depth in water measurements. The wireless communication device 600 may comprise a radio-frequency (RF) antenna 610, a duplexer 612, a receiver 620, a transmitter 630, a baseband processing module 640, a memory 650, a processor 660, a local oscillator generator (LOGEN) 670 and one or more transducers 680. In various embodiments of the subject technology, one or more of the blocks represented in FIG. 6 may be integrated on one or more semiconductor substrates. For example, the blocks 620-670 may be realized in a single chip or a single system on a chip, or may be realized in a multichip chipset.

The receiver 620 may comprise suitable logic circuitry and/or code that may be operable to receive and process signals from the RF antenna 610. The receiver 620 may, for example, be operable to amplify and/or down-convert received wireless signals. In various embodiments of the subject technology, the receiver 620 may be operable to cancel noise in received signals and may be linear over a wide range of frequencies. In this manner, the receiver 620 may be suitable for receiving signals in accordance with a variety of wireless standards, Wi-Fi, WiMAX, Bluetooth, and various cellular standards.

The transmitter 630 may comprise suitable logic circuitry and/or code that may be operable to process and transmit signals from the RF antenna 610. The transmitter 630 may, for example, be operable to up-convert baseband signals to RF signals and amplify RF signals. In various embodiments of the subject technology, the transmitter 630 may be operable to up-convert and amplify baseband signals processed in accordance with a variety of wireless standards. Examples of such standards may include Wi-Fi, WiMAX, Bluetooth, and various cellular standards. In various embodiments of the subject technology, the transmitter 630 may be operable to provide signals for further amplification by one or more power amplifiers.

The duplexer 612 may provide isolation in the transmit band to avoid saturation of the receiver 620 or damaging parts of the receiver 620, and to relax one or more design requirements of the receiver 620. Furthermore, the duplexer 612 may attenuate the noise in the receiver band. The duplexer 612 may be operable in multiple frequency bands of various wireless standards.

The baseband processing module 640 may comprise suitable logic, circuitry, interfaces, and/or code that may be operable to perform the processing of baseband signals. The baseband processing module 640 may, for example, analyze received signals and generate control and/or feedback signals for configuring various components of the wireless communication device 600, such as the receiver 620. The baseband processing module 640 may be operable to encode, decode, transcode, modulate, demodulate, encrypt, decrypt, scramble, descramble, and/or otherwise process data in accordance with one or more wireless standards.

The processor 660 may comprise suitable logic, circuitry, and/or code that may enable processing data and/or controlling operations of the wireless communication device 600. In this regard, the processor 660 may be enabled to provide control signals to various other portions of the wireless communication device 600. The processor 660 may also control transfer of data between various portions of the wireless communication device 600. Additionally, the processor 660 may enable the implementation of an operating system or otherwise execute code to manage operations of the wireless communication device 600.

The memory 650 may comprise suitable logic, circuitry, and/or code that may enable storage of various types of information such as received data, generated data, code, and/or configuration information. The memory 650 may comprise, for example, RAM, ROM, flash, and/or magnetic storage. In various embodiments of the subject technology, information stored in the memory 650 may be utilized for configuring the receiver 620 and/or the baseband processing module 640.

The LOGEN 670 may comprise suitable logic, circuitry, interfaces, and/or code that may be operable to generate one or more oscillating signals of one or more frequencies. The LOGEN 670 may be operable to generate digital and/or analog signals. In this manner, the LOGEN 670 may be operable to generate one or more clock signals and/or sinusoidal signals. Characteristics of the oscillating signals such as the frequency and duty cycle may be determined based on one or more control signals from, for example, the processor 660 and/or the baseband processing module 640.

In operation, the processor 660 may configure the various components of the wireless communication device 600 based on a wireless standard according to which it is desired to receive signals. Wireless signals may be received via the RF antenna 610, amplified, and down-converted by the receiver 620. The baseband processing module 640 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device 600, data to be stored to the memory 650, and/or information affecting and/or enabling operation of the wireless communication device 600. The baseband processing module 640 may modulate, encode, and perform other processing on audio, video, and/or control signals to be transmitted by the transmitter 630 in accordance with various wireless standards.

The one or more transducers 680 may include miniature transducers such as the highly integrated MEMS pressure sensor of the subject technology (e.g., 100A of FIG. 1A or 500A of FIG. 5A) that can detect the presence of water on the pressure sensor. The MEMS pressure sensor of the subject technology is a miniature device that can be readily integrated with the one or more transducers 680. In one or more implementations, the processor 660 can process signals from the one or more transducers 680 to determine environmental parameters such as pressure as well as elevation and depth in water, and so on.

In accordance with various aspects of the subject disclosure, an apparatus includes a housing, one or more piezoresistive elements and a magnetic actuator. The housing includes a membrane, and the piezoresistive elements are disposed on the membrane in order to sense a displacement due to a deflection of the membrane. The magnetic actuator is disposed inside a cavity of the housing. The magnetic actuator exerts a repulsive force onto the membrane in order to reduce the deflection of the membrane.

In accordance with other aspects of the subject disclosure, a pressure sensing device includes a housing, including a membrane, one or more piezoresistive elements, a first set of electrodes and a second set of electrodes. The piezoresistive elements are disposed on the membrane and can sense a displacement due to a deflection of the membrane. The first set of electrodes are disposed over the membrane, and the second set of electrodes are placed on a permeable port of the device at a distance from the membrane. The first and second sets of electrodes form an electrostatic actuator in order to exert a repulsive force onto the membrane and to reduce the deflection of the membrane.

In accordance with other aspects of the subject disclosure, a wireless communication device consists of a first housing, including a port disposed on a wall of the device and a sensor disposed in the first housing. The sensor includes a second housing, including a membrane and one or more piezoresistive elements disposed on the membrane and configured to sense a displacement due to a deflection of the membrane. An actuator is disposed inside a cavity of the second housing. The actuator exerts a repulsive force onto the membrane to reduce the deflection of the membrane.

Various types of signal processing described above can be implemented in digital electronic circuitry or in computer software, firmware or hardware. The techniques can be implemented using one or more computer program products. Programmable processors and computers can be included in or packaged as mobile devices. The processes and logic flows can be performed by one or more programmable processors and by one or more programmable logic circuitry. General and special-purpose computing devices and storage devices can be interconnected through communication networks.

Some implementations include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW), flash memory (e.g., SD cards, mini-SD cards, micro-SD cards), magnetic and/or solid-state hard drives, ultra-density optical discs, any other optical or magnetic media, and floppy disks. The computer-readable media can store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multicore processors that execute software, some implementations are performed by one or more integrated circuits, such as application-specific integrated circuits (ASICs) or field programmable gate arrays (FPGAs). In some implementations, such integrated circuits execute instructions that are stored on the circuit itself.

As used in this specification and any claims of this application, the terms "computer", "processor", and "memory" all refer to electronic or other technological devices. These terms exclude people or groups of people. For purposes of the specification, the terms "display" and "displaying" mean displaying on an electronic device. As used in this specification and any claims of this application, the terms "computer readable medium" and "computer readable media" are entirely restricted to tangible, physical objects that store information in a form that is readable by a computer. These terms exclude any wireless signals, wired download signals, and any other ephemeral signals.

Many of the above-described features and applications are implemented as software processes that are specified as a set of instructions recorded on a computer-readable storage medium (also referred to as a computer-readable medium). When these instructions are executed by one or more processing unit(s) (e.g., one or more processors, cores of processors, or other processing units), they cause the processing unit(s) to perform the actions indicated in the instructions.

In this specification, the term "software" is meant to include firmware residing in read-only memory or applications stored in magnetic storage, which can be read into memory for processing by a processor. Also, in some implementations, multiple software aspects of the subject disclosure can be implemented as subparts of a larger program while remaining distinct software aspects of the subject disclosure. In some implementations, multiple software aspects can also be implemented as separate programs. Finally, any combination of separate programs that together implement a software aspect described herein is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, or declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network.

It is understood that any specific order or hierarchy of blocks in the processes disclosed is an illustration of example approaches. Based upon design preferences, it is understood that the specific order or hierarchy of blocks in the processes may be rearranged, or that all illustrated blocks may be performed. Some of the blocks may be performed simultaneously. For example, in certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation, or the processor being operable to monitor and control the operation. Likewise, a processor configured to execute code can be construed as a processor programmed to execute code or operable to execute code.

A term such as an "aspect" does not imply that such aspect is essential to the subject technology or that such aspect applies to all configurations of the subject technology. A disclosure relating to an aspect may apply to all configurations, or one or more configurations. A term such as "an aspect" may refer to one or more aspects and vice versa. A term such as a "configuration" does not imply that such configuration is essential to the subject technology or that such configuration applies to all configurations of the subject technology. A disclosure relating to a configuration may apply to all configurations, or one or more configurations. A term such as "a configuration" may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A pressure-sensing device, the device comprising:
    a housing including a membrane;
    one or more piezoresistive elements disposed on the membrane and configured to sense a displacement due to a deflection of the membrane;
    a first set of electrodes disposed over the membrane; and
    a second set of electrodes disposed on a permeable port of the device at a distance from the membrane,
    wherein the first set of electrodes and the second set of electrodes form an electrostatic actuator configured to exert a repulsive force onto the membrane to reduce the deflection of the membrane.

2. The device of claim 1, wherein the electrostatic actuator is further configured to measure an ambient pressure by sensing a change of capacitance between the first set and the second set of electrodes due to deflection of the membrane.

3. The device of claim 2, wherein the electrostatic actuator is further configured to extend a range of pressure measurement by reducing the deflection of the membrane and preventing deflection saturation of the membrane.

4. The device of claim 2, wherein the electrostatic actuator and the one or more piezoresistive elements are configured to enable detection of presence of contaminants by sensing a change in a damping parameter of the membrane due to a mass of a contaminant.

5. The device of claim 4, wherein the electrostatic actuator is configured to vibrate the membrane in response to an excitation at a set frequency.

6. The device of claim 4, wherein the one or more piezoresistive elements are configured to enable measurement of a damping of vibrations of the membrane.

7. The device of claim 4, wherein the contaminants include water and solid contaminants, and wherein the electrostatic actuator is configured to enable avoiding an inaccurate recording of exercise minutes or flights of stairs climbed due to pressure swings caused by evaporation of the water and capillary forces.

8. The device of claim 1, wherein the one or more piezoresistive elements and the electrostatic actuator are configured to individually enable use of the device as a microphone.

9. An apparatus comprising:
    a membrane including one or more piezoresistive elements configured to sense a displacement due to a deflection of the membrane; and
    a first set of electrodes disposed over the membrane and a second set of electrodes disposed on a permeable port at a distance from the membrane to exert a repulsive force onto the membrane to reduce the deflection.

10. The apparatus of claim 9, wherein the first set of electrodes and the second set of electrodes form an electrostatic actuator configured to measure an ambient pressure.

11. The apparatus of claim 10, the electrostatic actuator is configured to vibrate the membrane in response to an excitation at a set frequency.

12. The apparatus of claim 10, wherein the one or more piezoresistive elements are configured to enable measurement of a damping of vibrations of the membrane.

13. The apparatus of claim 10, wherein the electrostatic actuator is configured to measure the ambient pressure by sensing a change of a capacitance between the first set and the second set of electrodes due to deflection of the membrane.

14. The apparatus of claim 10, wherein the electrostatic actuator and the one or more piezoresistive elements are configured to enable detection of presence of contaminants by sensing a change in a damping parameter of the membrane due to a mass of a contaminant.

15. The apparatus of claim 14, wherein the contaminants include water and solid contaminants, and wherein the electrostatic actuator is configured to enable avoiding an inaccurate recording of exercise minutes or flights of stairs climbed due to pressure swings caused by evaporation of the water and capillary forces.

16. The apparatus of claim 14, wherein the electrostatic actuator is further configured to extend a range of pressure measurement by reducing the deflection to prevent deflection saturation.

17. A communication device comprising:
a pressure sensor component enclosed in a housing and including:
a membrane;
a permeable port at a distance from the membrane;
one or more piezoresistive elements disposed on the membrane and configured to sense a displacement due to a deflection of the membrane;
a first set of electrodes disposed over the membrane; and
a second set of electrodes disposed on the permeable port.

18. The communication device of claim 17, wherein the first set and second set of electrodes form an electrostatic actuator configured to:
measure an ambient pressure by sensing a change of a capacitance between the first set of electrodes and the second set of electrodes due to the deflection; and
exert a repulsive force onto the membrane to reduce the deflection and extend a range of a pressure measurement by reducing the deflection and preventing a deflection saturation.

19. The communication device of claim 18, wherein the electrostatic actuator is further configured to vibrate the membrane in response to an excitation at a set frequency, and wherein the electrostatic actuator and the one or more piezoresistive elements are configured to enable detection of presence of contaminants by sensing a change in a damping parameter of the membrane due to a mass of a contaminant.

* * * * *